(12) United States Patent
Ito et al.

(10) Patent No.: US 7,126,138 B2
(45) Date of Patent: Oct. 24, 2006

(54) ELECTRON FLOOD APPARATUS AND ION IMPLANTATION SYSTEM

(75) Inventors: Hiroyuki Ito, Narita (JP); Yasuhiko Matsunaga, Sakura (JP); Hiroji Hanawa, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 60 days.

(21) Appl. No.: 10/942,619

(22) Filed: Sep. 16, 2004

(65) Prior Publication Data

US 2005/0116156 A1 Jun. 2, 2005

(30) Foreign Application Priority Data

Sep. 19, 2003 (JP) .............................. 2003-328800

(51) Int. Cl.
*H01J 37/08* (2006.01)

(52) U.S. Cl. ................. 250/492.21; 250/251; 250/398; 250/423 R; 315/111.81

(58) Field of Classification Search ..................... None
See application file for complete search history.

(56) References Cited

U.S. PATENT DOCUMENTS

| | | | |
|---|---|---|---|
| 6,100,536 A * | 8/2000 | Ito et al. ................. | 250/492.21 |
| 6,285,133 B1 * | 9/2001 | Lansford et al. ........ | 315/111.81 |
| 6,348,126 B1 | 2/2002 | Hanawa et al. | |
| 6,410,449 B1 | 6/2002 | Hanawa et al. | |
| 6,453,842 B1 | 9/2002 | Hanawa et al. | |
| 6,468,388 B1 | 10/2002 | Hanawa et al. | |
| 6,494,986 B1 | 12/2002 | Hanawa et al. | |
| 6,551,446 B1 | 4/2003 | Hanawa et al. | |
| 6,891,173 B1 * | 5/2005 | Gammel et al. ........ | 250/492.21 |

FOREIGN PATENT DOCUMENTS

JP    11-073908    3/1999

* cited by examiner

*Primary Examiner*—Jack Berman
*Assistant Examiner*—Zia R. Hashmi
(74) *Attorney, Agent, or Firm*—Patterson & Sheridan, LLP

(57) ABSTRACT

An electron flood apparatus 1 of the present invention comprises a chamber 22 having a first part 22a made of conductive material and a second part 22b made of insulating material, and extending along a predefined closed curve Ax. A coil 18 is provided outside the first part 22a to generate a magnetic field in a direction intersecting with the surface formed by the predefined closed curve Ax. The coil 18 and the chamber 22 are inductively coupled by the magnetic field. Since the inert gas plasma is generated in the chamber 22 mainly by inductive coupling, electrons contained in the plasma have a low energy. Here, by applying voltage to an electrode 21, electrons having a low energy in the chamber 22 are emitted from an opening 14.

17 Claims, 8 Drawing Sheets

ELECTRON FLOOD APPARATUS AND ION IMPLANTATION SYSTEM

BACKGROUND OF THE INVENTION

1. Field of the Invention

The present invention relates to electron flood apparatuses and ion implantation systems.

2. Related Background Art

Ion implantation systems are used for introducing dopant into substrates. In an ion implantation process, positive charge accumulates on the surface of the insulating layer of the substrate because the ions implanted onto the substrate are usually cations. If the voltage applied to the insulating layer by means of the accumulated charge exceeds a dielectric breakdown voltage, the device may be damaged.

Typically, an ion implantation system comprises an electron flood apparatus for supplying electrons to neutralize the accumulated charge on the substrate. As electron flood apparatuses, for example, an electron flood apparatus comprising filaments such as tungsten is known.

However, there are problems with an electron flood apparatus using filaments, such as contamination due to foreign matter from the filaments, or life This application claims priority to Japan Application Serial No. 2003-328800, filed Sep. 19, 2003. shortening of the filaments. Accordingly, electron flood apparatuses referred to as plasma flood systems or the like are known as electron flood apparatuses for solving these problems (see, for example, Japanese Patent Application Laid-Open No. 11-73908).

FIG. 8 is a cross-sectional view of an electron flood apparatus referred to as a plasma flood system or the like. This electron flood apparatus comprises an insulative chamber 155 and an electrode 215 provided in the chamber 155. The chamber 155 is made of, for example, alumina, quartz, BN, sapphire or the like. The chamber 155 has an opening 165. The opening 165 is in communication with an opening 145 provided in a side wall of a tube 135 through which an ion beam 185 passes.

Ar gas is supplied from a supply port 175 into the chamber 155. The outer circumference of the chamber 155 is wrapped with a coil 185, which is connected to an RF power source 195 via an impedance matching circuit 205. Plasma of Ar gas is generated in the chamber 155 by RF electric power supplied from the RF power source 195. Here, if voltage is applied to the electrode 215 by means of the power source 225, electrons contained in the plasma are supplied into the tube 135 from the opening 165.

SUMMARY OF THE INVENTION

Now, electron flood apparatuses generate electrons for neutralizing positive charge on the substrate due to ion implantation. If these electrons have a high energy, it may lead to accumulation of negative charge on the substrate, as well as neutralization of the positive charge accumulated on the substrate. The accumulated charge may cause a negative charge-up voltage.

On the other hand, the dielectric breakdown voltage of the insulating layer has been progressively dropping along with miniaturizing of semiconductor devices. It is thus necessary to prevent the charge-up voltage of the substrate from exceeding the dielectric breakdown voltage so as not to breakdown the device.

However, the result of examination by the inventor has revealed that, with the electron flood apparatus shown in FIG. 8, electrons contained in the plasma generated in the chamber 155 have a high energy. Since the chamber 155 in this electron flood apparatus is made of insulating material, an electric field, as well as the magnetic field, generated by the coil 185 passes into the chamber 155 from outside the chamber 155. The electrons contained in the plasma are considered to have a high energy because the capacitive coupling due to the electric field contributes to generation of plasma.

In addition, with the electron flood apparatus 1 shown in FIG. 8, particles of the conductive material composing the electrode 215 stick to the internal surface of the chamber 155 by sputtering when plasma is generated in the chamber 155. The internal surface of the chamber 155 may be gradually covered with the conductive material due to this phenomenon. Accordingly, a Faraday shield prevents the electric field from penetrating into the chamber 155 from outside the chamber 155. Hence, the conductive material must be removed because the plasma in the chamber 155 can no longer be preserved. Therefore, more maintenance workload is required with the electron flood apparatus shown in FIG. 8.

Thus it is an object of the present invention to provide an electron flood apparatus and an ion implantation system comprising the same, which can emit low-energy electrons and reduce maintenance workload.

In order to solve the above-mentioned problems, the electron flood apparatus of the present invention for use in an ion implantation system to generate electrons comprises: (a) a chamber having an opening for emitting electrons, a supply port for supplying inert gas, a first part made of conductive material and a second part made of insulating material, and extending along a predefined closed curve, (b) a magnetic field generator provided outside the first part to generate a magnetic field in a direction intersecting with a surface formed by the predefined closed curve, and (c) an electrode provided inside the chamber.

According to the electron flood apparatus, the magnetic field generated by the magnetic field generator intersects with the surface formed by the predefined closed curve. The chamber and the magnetic field generator are inductively coupled by the magnetic field to generate inert gas plasma in the chamber. On the other hand, the electric field generated by the magnetic field generator cannot pass through the first part made of conductive material.

Accordingly, plasma due to capacitive coupling is suppressed whereas plasma mainly due to inductive coupling is generated in the chamber. Thus the electrons contained in the plasma have a low energy. Here, if an electronegative potential is applied to the electrode, electrons having a low energy in the plasma are emitted from the opening.

In addition, the chamber, being insulated from the electrode, supports the electrode, the electrode extending along the predefined closed curve. In this case, the electrode can be elongated because the chamber is extending. Therefore, the surface area of the electrode can be made larger to increase the emission of electrons emitted from the opening.

In addition, the electron flood apparatus of the present invention is an electron flood apparatus for use in an ion implantation system to generate electrons, and comprises: an annular chamber having an opening for emitting electrons, a supply port for supplying inert gas, a cylindrical first part made of conductive material, and a cylindrical second part made of insulating material connected to the first part, a magnetic field generator provided outside the first part to generate magnetic field in a direction intersecting with a surface formed by the annular chamber, and an electrode provided inside the chamber.

According to the electron flood apparatus, the magnetic field generated by the magnetic field generator intersects with the surface formed by the annular chamber. The chamber and the magnetic field generator are inductively coupled by the magnetic field to generate inert gas plasma in the chamber. On the other hand, the electric field generated by the magnetic field generator cannot pass through the first part.

Accordingly, plasma due to capacitive coupling is suppressed whereas plasma mainly due to inductive coupling is generated in the chamber. Thus the electrons contained in the plasma have a low energy. Here, if an electronegative potential is applied to the electrode, electrons having a low energy in the plasma are emitted from the opening.

In addition, the chamber, being insulated from the electrode, supports the electrode, the electrode extending along the chamber. In this case, the electrode can be elongated because the chamber is extending. Therefore, the surface area of the electrode can be made larger, increasing the emission of electrons emitted from the opening.

In addition, the electron flood apparatus further comprises a cathode power source electrically connected to an electrode and a high-frequency power source electrically connected to the magnetic field generator. When electric power is supplied to the magnetic field generator from the high-frequency power source and inert gas is introduced into the chamber, plasma is generated in the chamber by inductive coupling. Here, emission of electrons being emitted from the opening can be controlled by controlling the voltage applied to the electrode by the cathode power source.

In addition, the electron flood apparatus of the present invention for use in an ion implantation system to generate electrons comprises: (a) a chamber having an opening for emitting electrons, a supply port for supplying inert gas, a first part made of conductive material and a second part made of insulating material, and extending along a predefined closed curve, (b) a magnetic field generator provided outside the first part to generate a magnetic field in a direction intersecting with a surface formed by the predefined closed curve, and (c) a terminal electrically connected to the first part.

According to the electron flood apparatus, the magnetic field generated by the magnetic field generator intersects with the surface formed by the predefined closed curve. The chamber and the magnetic field generator are inductively coupled by the magnetic field to generate inert gas plasma in the chamber. On the other hand, the electric field generated by the magnetic field generator cannot pass through the first part made of conductive material.

Accordingly, plasma due to capacitive coupling is suppressed whereas plasma mainly due to inductive coupling is generated in the chamber. Thus the electrons contained in the plasma have a low energy. Here, if an electronegative potential is applied to the first part, electrons having a low energy in the plasma are emitted from the opening.

In addition, the electron flood apparatus of the present invention is an electron flood apparatus for use in an ion implantation system to generate electrons, and comprises: an annular chamber having an opening for emitting electrons, a supply port for supplying inert gas, a cylindrical first part made of conductive material, and a cylindrical second part made of insulating material connected to the first part, a magnetic field generator provided outside the first part to generate magnetic field in a direction intersecting with a surface formed by the annular chamber, and a terminal electrically connected to the first part.

According to the electron flood apparatus, the magnetic field generated by the magnetic field generator intersects with the surface formed by the annular chamber. The chamber and the magnetic field generator are inductively coupled by the magnetic field to generate inert gas plasma in the chamber. On the other hand, the electric field generated by the magnetic field generator cannot pass through the first part.

Accordingly, plasma due to capacitive coupling is suppressed whereas plasma mainly due to inductive coupling is generated in the chamber. Thus the electrons contained in the plasma have a low energy. Here, if an electronegative potential is applied to the first part, electrons having a low energy in the plasma are emitted from the opening.

In addition, the electron flood apparatus further comprises a cathode power source electrically connected to a terminal and a high-frequency power source electrically connected to the magnetic field generator. When electric power is supplied to the magnetic field generator from the high-frequency power source and inert gas is introduced into the chamber, plasma is generated in the chamber by inductive coupling. Here, emission of electrons being emitted from the opening can be controlled by controlling the voltage applied to the terminal by the cathode power source.

In addition, the magnetic field generator is a coil with conductive wire wound around the core made of magnetic material, whereby the strength of the magnetic field generated by the magnetic field generator can be increased.

Furthermore, the chamber has a third part made of insulating material, whereby ignition of plasma is facilitated, which in turn facilitates generation of plasma in the chamber.

In addition, the ion implantation system of the present invention comprises the above-mentioned electron flood apparatus and a tube through which an ion beam passes, the side wall of the tube having an opening, and the opening of the tube being in communication with the opening of the chamber of the above-mentioned electron flood apparatus. According to the ion implantation system, the low-energy electrons generated in the chamber of the above-mentioned electron flood apparatus are provided into the tube through the opening.

Furthermore, the chamber has another opening and the side wall of the tube has another opening, the other opening of the tube being in communication with the other opening of the chamber. Hence additional electrons are supplied into the tube through the other opening, whereby enabling supply of electrons into the tube from a plurality of paths.

Moreover, inert gas includes at least one of rare gas and nitrogen gas.

BRIEF DESCRIPTION OF THE DRAWINGS

FIG. 8 is a cross-sectional view of an electron flood apparatus referred to as a plasma flood system or the like.

DESCRIPTION OF THE PREFERRED EMBODIMENTS

Figure 1:
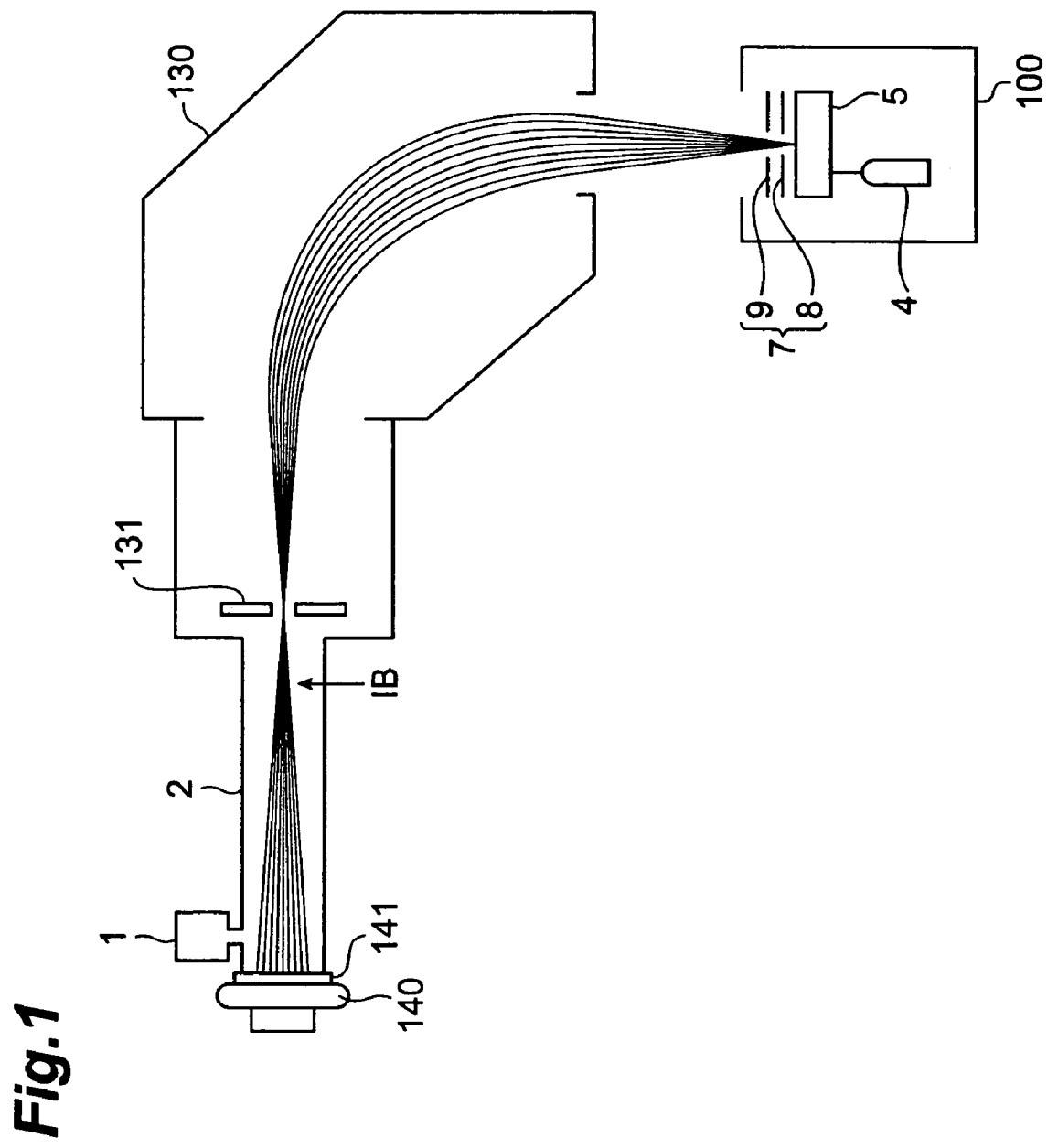
FIG. 1 is a schematic diagram showing an exemplary ion implantation system.

An electron flood apparatus and an ion implantation system according to embodiments will be explained in the following. Hereafter, identical elements are designated by identical reference numerals and duplicate explanation will be omitted.

(First Embodiment)

FIG. 1 is a diagram schematically showing an exemplary ion implantation system. The ion implantation system comprises an ion extraction assembly 100, an ion mass selector 130, a tube 2 through which an ion beam IB passes, an electron flood apparatus 1 for providing electrons into the tube 2, and a substrate holder 140 for holding a substrate 141 on which ions are implanted.

The ion extraction assembly 100 includes an ion source 5, a gas supply source 4 for supplying predefined gas to the ion source 5, and a pair of extraction electrodes 8, 9 (extraction electrode system 7). The ions extracted from the ion source 5 are injected into the ion mass selector 130. In the ion mass selector 130, the ion beam IB composed of ions having a predefined mass number and energy is emitted from a mass selection slit 131. The emitted ion beam IB passes through the tube 2 and reaches the substrate 141. Specifically, the substrate 141 is, for example, a semiconductor wafer, and the implanted ion species are, for example, $B^+$, $BF_2^+$, $P^+$, $As^+$, or the like.

Figure 2:
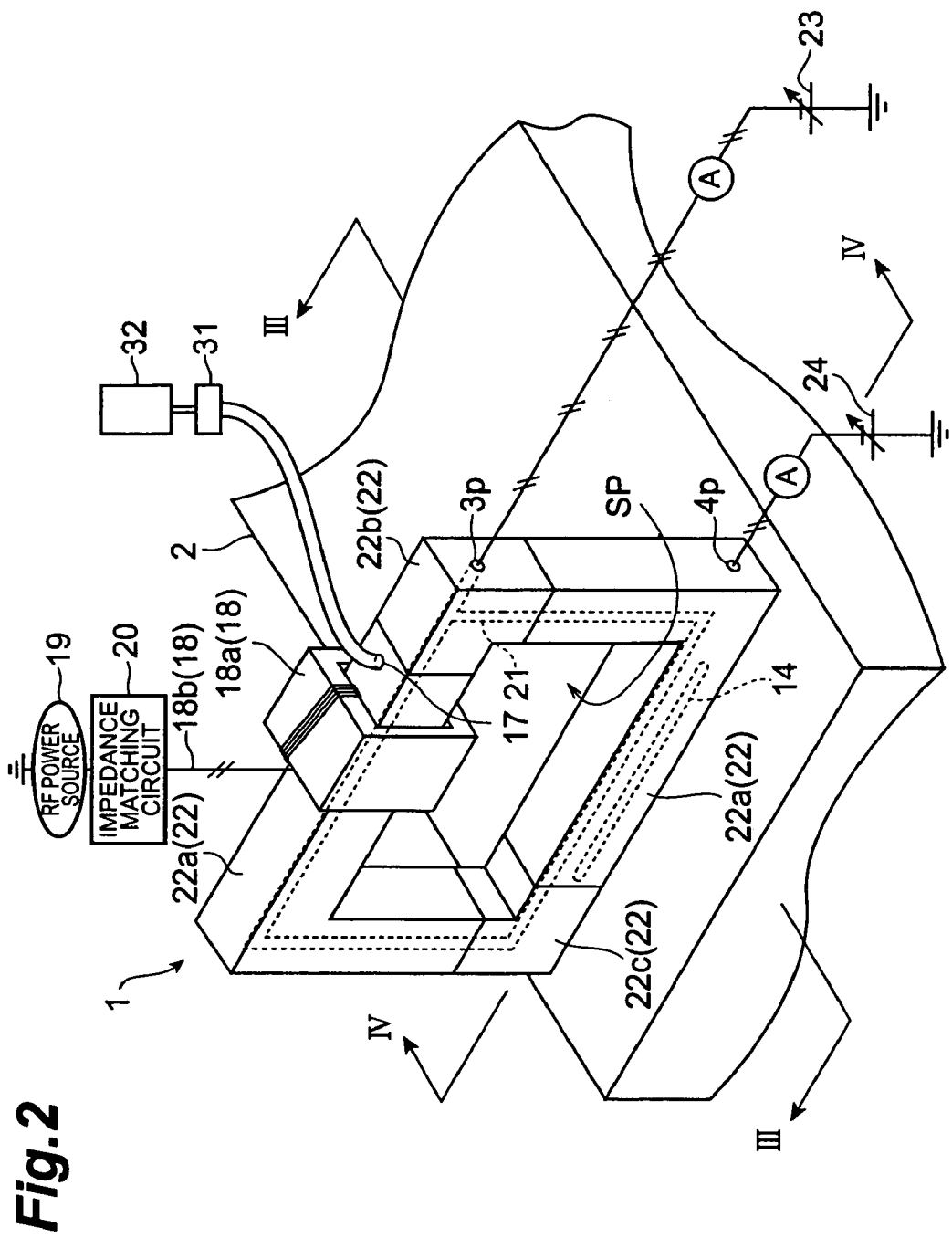
FIG. 2 is a perspective view schematically showing a part of the ion implantation system comprising an electron flood apparatus according to the first embodiment.
Figure 3:
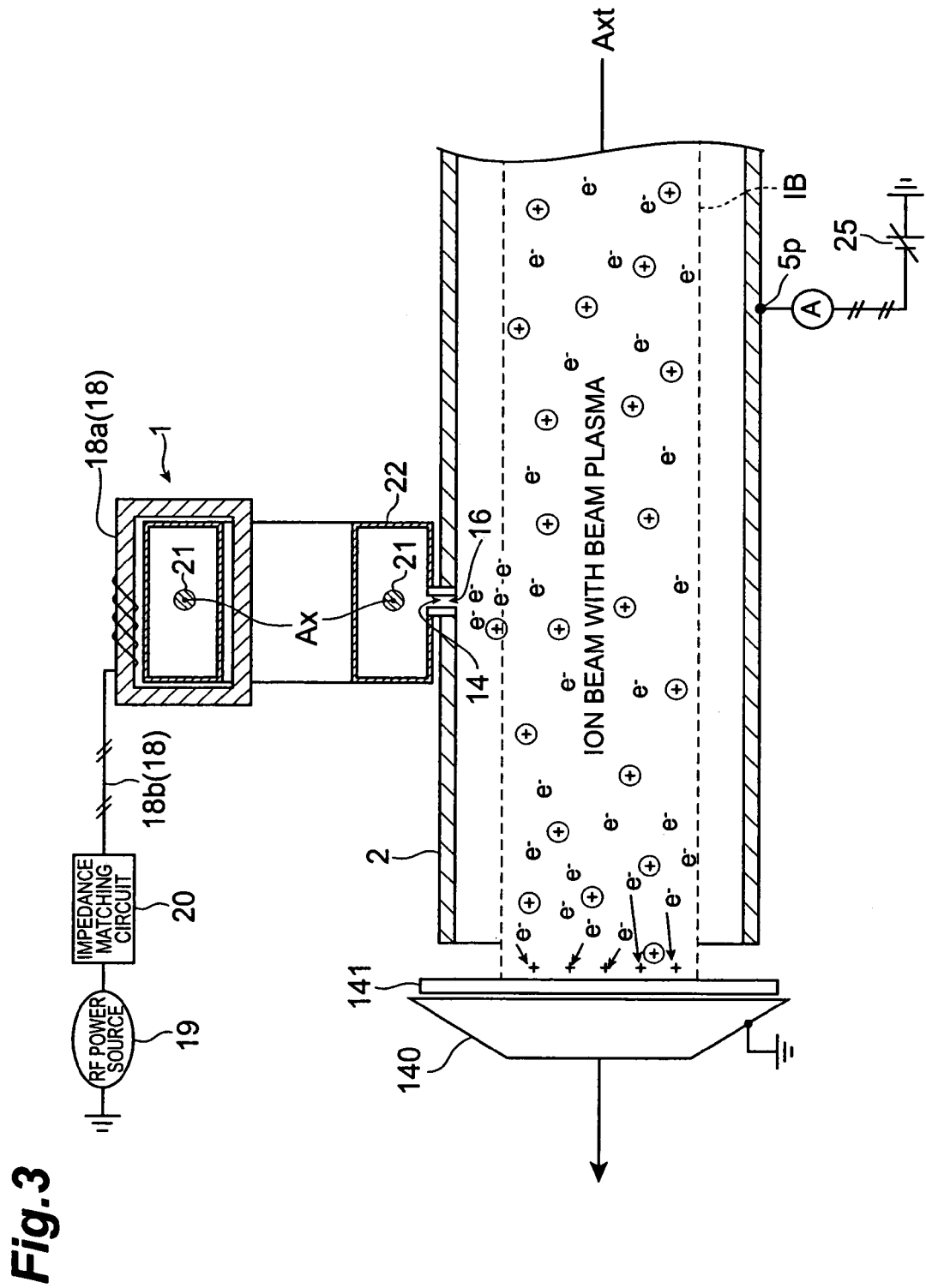
FIG. 3 is a cross-sectional view taken along a line III—III shown in FIG. 2.
Figure 4:
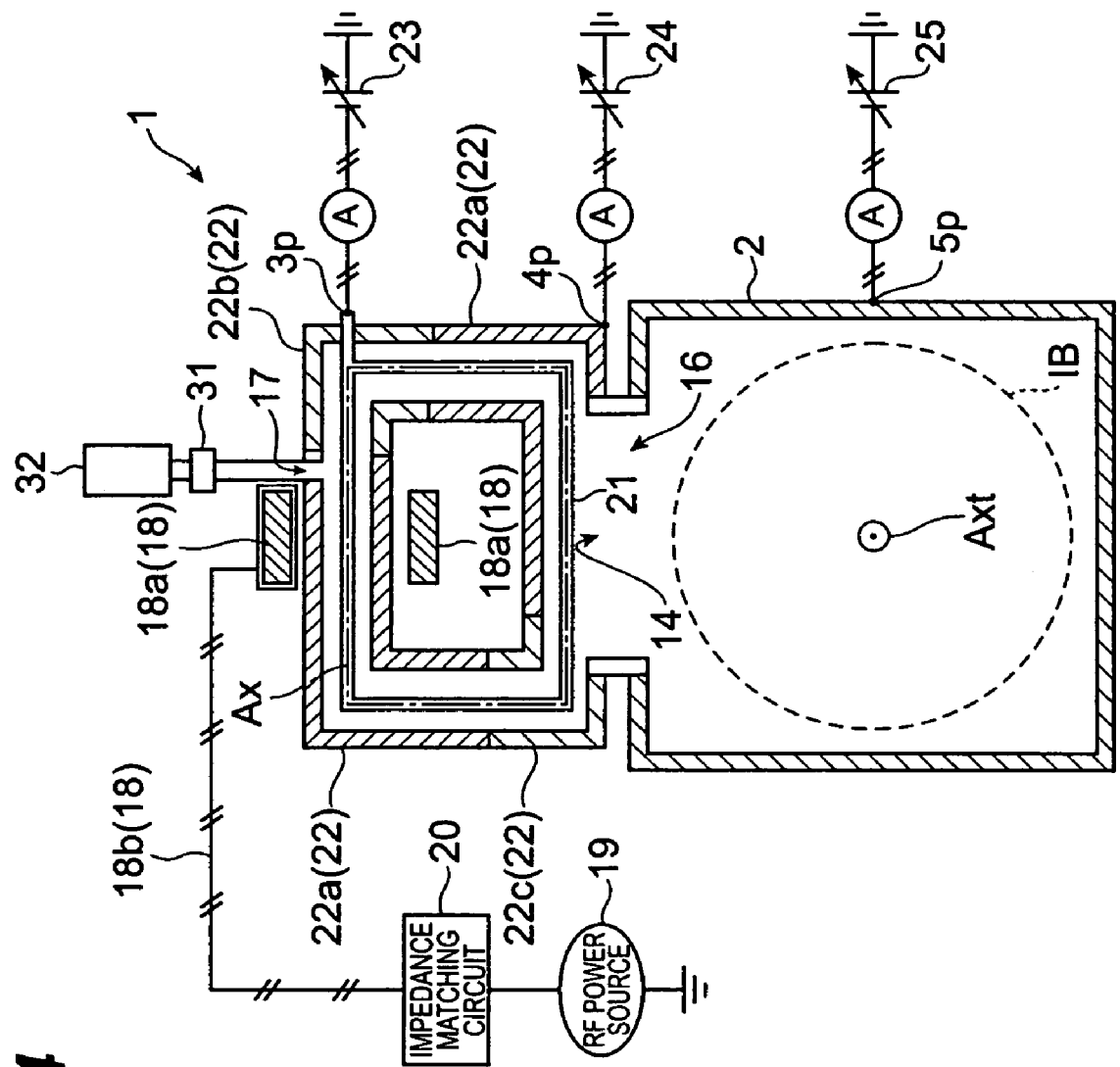
FIG. 4 is a cross-sectional view taken along a line IV—IV shown in FIG. 2.

FIG. 2 is a perspective view schematically showing a part of the ion implantation system comprising an electron flood apparatus 1 according to the first embodiment. FIG. 3 is a cross-sectional view taken along a line III—III shown in FIG. 2. FIG. 4 is a cross-sectional view taken along a line IV—IV shown in FIG. 2.

The electron flood apparatus 1, for use by the ion implantation system, supplies electrons to the tube 2. The ion beam IB with beam plasma passes through the tube 2 along a predefined axis Axt.

The electron flood apparatus 1 comprises an annular chamber 22 having a first cylindrical part 22a made of conductive material, a second and a third cylindrical parts 22b and 22c connected to the first part 22a and made of insulating material. The chamber 22, extending along a predefined closed curve Ax, has, in the present embodiment, a toroidal configuration for example. The first to the third cylindrical parts 22a–22c are arranged along the predefined closed curve Ax so that the chamber 22 forms a ring. A coil 18 (magnetic field generator) is provided outside the first part 22a, and an electrode 21 is provided inside the chamber 22.

The first part 22a of the chamber 22 is preferably made of nonmagnetic conductive material such as, for example, aluminum, or graphite. In this case, the first part 22a of the chamber 22 remains conductive even if particles generated by sputtering come flying from the electrode 21 and stick on the internal surface of the chamber 22. Thus, the electron flood apparatus 1 according to the first embodiment can reduce maintenance workload in comparison with an electron flood apparatus having an insulative chamber.

The second and the third parts 22b and 22c of the chamber 22 are preferably made of, for example, alumina, quartz, or the like. The chamber 22 has the third part 22c, which has a plurality of, for example two, insulative parts. In other words, it may be perceived that the ring made of conductive material is segmented by a plurality of insulative parts. In this case, ignition of the plasma generated in the chamber 22 becomes easier than the case of a single insulative part, thereby facilitating generation of plasma. The thickness of the wall of chamber 22 is, for example, 2 to 10 mm. In addition, the chamber 22 comprises an opening 14 for emitting electrons and a supply port 17 for supplying inert gas.

A gas supply source 32 of inert gas is connected to the supply port 17, via an MFC (mass flow controller) 31 which adjusts the flow rate of inert gas supplied into the chamber 22. Inert gas is supplied into the chamber 22 from the gas supply source 32, and emitted into the tube 2 through the opening 16 of the tube 2 from the opening 14 of the chamber 22. The pressure inside the chamber 22 is kept at a predefined pressure, for example, $1 \times 10^{-1}$ to $10^{-2}$ Torr by controlling the MFC 31. The inert gas, including at least one of rare gas and nitrogen gas, may be, for example, argon (Ar) gas.

The opening 14 is in communication with the opening 16 provided on the side wall of the tube 2 of the ion implantation system. The pressure inside the tube 2 is, for example, $1 \times 10^{-5}$ to $10^{-6}$ Torr. The opening 14 may have a slit-like configuration, for example, but is not limited to this. The size of the opening 14 is preferably configured so that the electrons in the chamber 22 are sufficiently supplied into the tube 2, making the inert gas and plasma in the chamber 22 difficult to move into the tube 2.

The coil 18 comprises a core 18a made of magnetic material such as ferrum, for example, with conductive wire 18b wound thereon. The configuration being annular, for example, the core 18 is provided so that it is wound around the predefined closed curve Ax. Here, as a magnetic field generator, a coil composed of the conductive wire 18b may be used instead of using the core 18a. Using the core 18a can increase the strength of the magnetic field generated by the coil 18.

An RF power source 19 (high-frequency power source) is electrically connected to the coil 18, via an impedance matching circuit 20. The RF power source 19 can supply electric power of, for example, 500 W to 1 kW to the coil 18. Upon receipt of the electric power, the coil 18 generates a high-frequency magnetic field. The coil 18 being provided outside the chamber 22, the direction of the magnetic field generated by the coil 18 may be the direction intersecting with the surface formed by the predefined closed curve Ax, i.e., the direction intersecting with the surface formed by the annular chamber 22 so that electromagnetic induction is obtained. In addition, the magnetic field generated by the coil 18 may be a magnetic field penetrating through a space SP inside the inner circumference (central side) of the chamber 22 from one open side of the space SP to the other open side.

The chamber 22 and the coil 18 are inductively coupled by the magnetic field to generate inert gas plasma in the chamber 22. On the other hand, the electric field generated by the coil 18 cannot pass through the first part 22a because it is blocked by the first part 22a made of conductive material. Therefore, generation of plasma by capacitive coupling being suppressed, plasma is generated mainly due to inductive coupling and preserved in chamber 22, whereby electrons contained in the plasma have a low energy.

The electrode 21, being supported by the chamber 22 via an insulator such as the second part 22b, for example, and insulated from the chamber 22, extends along the predefined closed curve Ax. The electrode 21 has, for example, a plate-like or a wire-like configuration. Since the chamber 22 extends along the predefined closed curve Ax, the electrode 21 can also be elongated along the predefined closed curve Ax, whereby surface area of the electrode 21 can be widened and emission of electrons emitted from the opening 14 can be increased. In addition, the electrode 21 can be made of conductive material such as graphite and aluminum, for example.

A cathode power source 23 is electrically connected to the electrode 21, via a terminal 3p. The cathode power source 23 can apply a voltage between 0 and −100V to the electrode 21. The substrate holder 140 is grounded and the electric potential of the substrate 141 is set to 0V.

Emission of electrons emitted from the opening 14 can be controlled by controlling the negative voltage applied to the electrode 21 by the cathode power source 23. For example, if the electric potential of the electrode 21 is set to a negative potential, the electrons emitted from the opening 14 move into the beam plasma because imbalance of charge occurs. At this time, if the surface of the substrate 141 is positively charged, electrons in the beam plasma are extracted, whereby positive charge on the surface of the substrate 141 is neutralized.

Here, the electric potential of the electrode 21 is preferably 0 to −5V. In this case, the electrons contained in the plasma have a low energy. If the electric potential of the electrode 21 exceeds −5V, secondary electrons having a high energy may be emitted from the surface of the electrode 21.

As discussed above, the electron flood apparatus 1 can supply electrons having a low energy into the tube 2. Furthermore, using the electron flood apparatus 1, maintenance workload can be reduced. In addition, if an ion implantation system comprising the electron flood apparatus 1 is used, the amount of the accumulated charge on the substrate 141 can be reduced.

Here, a power source 24 may be electrically connected to the chamber 22, via a terminal 4p. The power source 24 can apply a voltage between 0 and −50V to the chamber 22, whereby emission of electrons emitted from the opening 14 can be controlled. This is because the power source 24 provides an electric potential difference between the chamber 22 and the beam plasma.

In addition, a power source 25 may be connected to the tube 2 of the ion implantation system, via a terminal 5p. The power source 25 can apply a voltage between 0 and −10V to the tube 2, whereby the lock-in effect of the beam plasma in the tube 2 can be adjusted.

(Second Embodiment)

Figure 5:
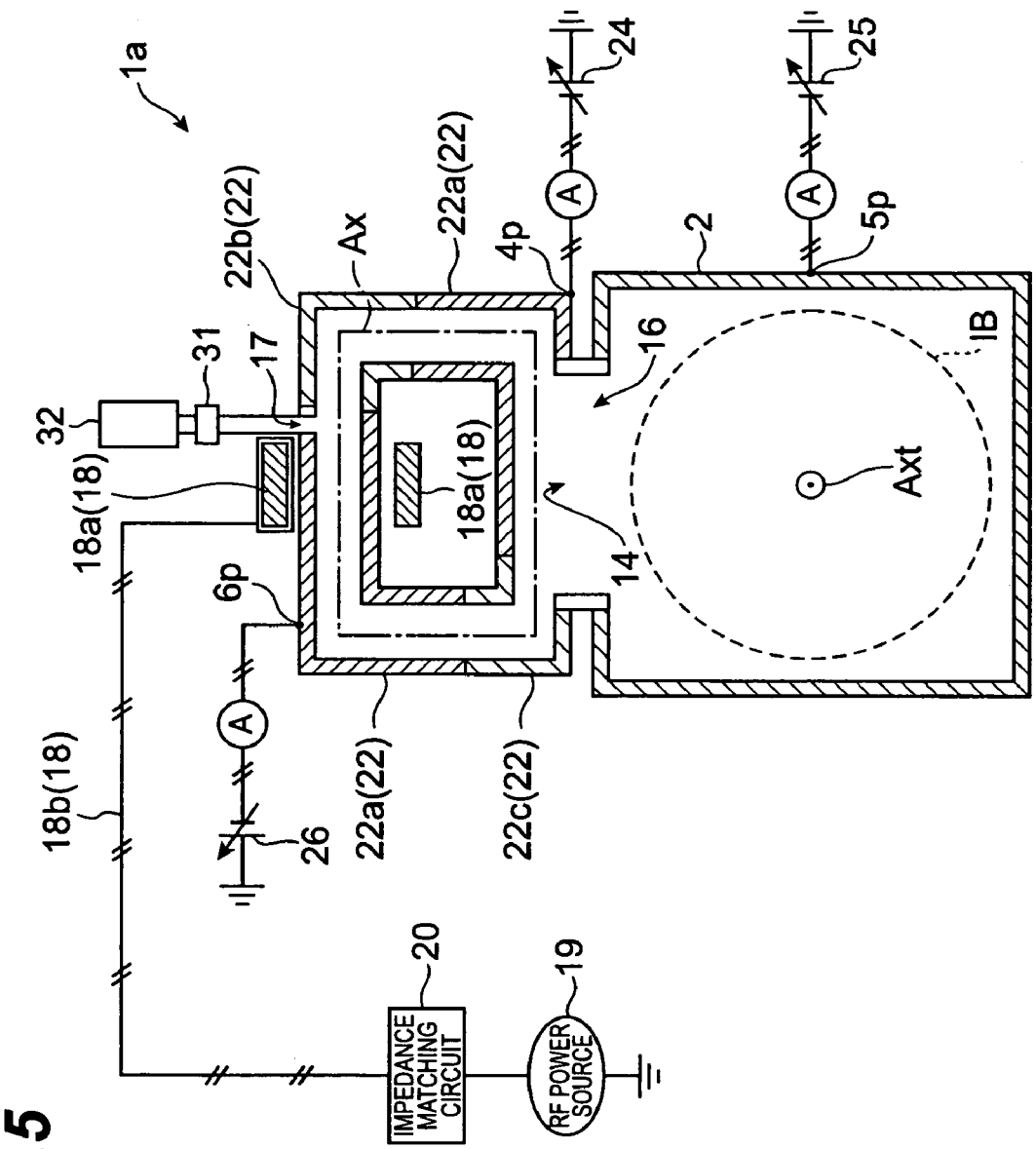
FIG. 5 is a cross-sectional view showing a part of the ion implantation system comprising an electron flood apparatus according to the second embodiment.

FIG. 5 is a cross-sectional view schematically showing a part of an ion implantation system comprising an electron flood device 1a according to the second embodiment. The ion implantation system has the electron flood apparatus 1a, which has replaced the electron flood apparatus 1 shown in FIGS. 2 to 4.

Unlike the electron flood apparatus 1, the electron flood apparatus 1a does not include the electrode 21. In the electron flood apparatus 1a, a first part 22a made of conductive material serves as the electrode 21. Thus, the structure of the electron flood apparatus 1a can be simplified compared with the structure of the electron flood apparatus 1. In addition, maintenance workload can be further reduced due to lack of the electrode 21 being the target of sputtering.

The electron flood apparatus 1a comprises, as with the electron flood apparatus 1, a chamber 22 and a coil 18. Furthermore, in the electron flood apparatus 1a, power sources 24 and 26 are electrically connected to the first part 22a made of conductive material via terminals 4p and 6p, respectively. The power sources 24 and 26 are cathode power sources which can apply a voltage between 0 and −100V. In addition, a substrate holder 140 is typically grounded, whereby the electric potential of the substrate 141 is set to 0V.

Here, the terminals are provided respectively in the parts made of conductive material electrically isolated. In the electron flood apparatus 1a, for example, the two terminals 4p and 6p are provided because there are two electrically isolated parts made of conductive material in the first part 22a.

As with the electron flood apparatus 1, inert gas is supplied from the gas supply source 32 into the chamber 22. The RF power source 19 is electrically connected to the coil 18 to provide electric power from the RF power source 19, whereby electrons contained in the plasma have a low energy because plasma is generated not by capacitive coupling but mainly by inductive coupling in the chamber 22.

Now, when voltage is applied to the first part 22a by the power sources 24 and 26, electrons contained in the plasma move from the opening 14 into the tube 2 and reach the substrate 141. In this regard, emission of electrons can be controlled by controlling the applied voltage. For example, raising the applied voltage increases emission of electrons. The applied voltage of the power sources 24 and 26 is preferably a voltage around −5V, for example, which does not provide electrons with excessive energy.

As discussed above, the electron flood apparatus 1a can supply electrons having a low energy into the tube 2. In addition, with the electron flood apparatus 1a, maintenance workload can be further reduced. By using the ion implantation system comprising the electron flood apparatus 1a, the amount of charge accumulating on the substrate 141 can be reduced.

(Third Embodiment)

Figure 6:
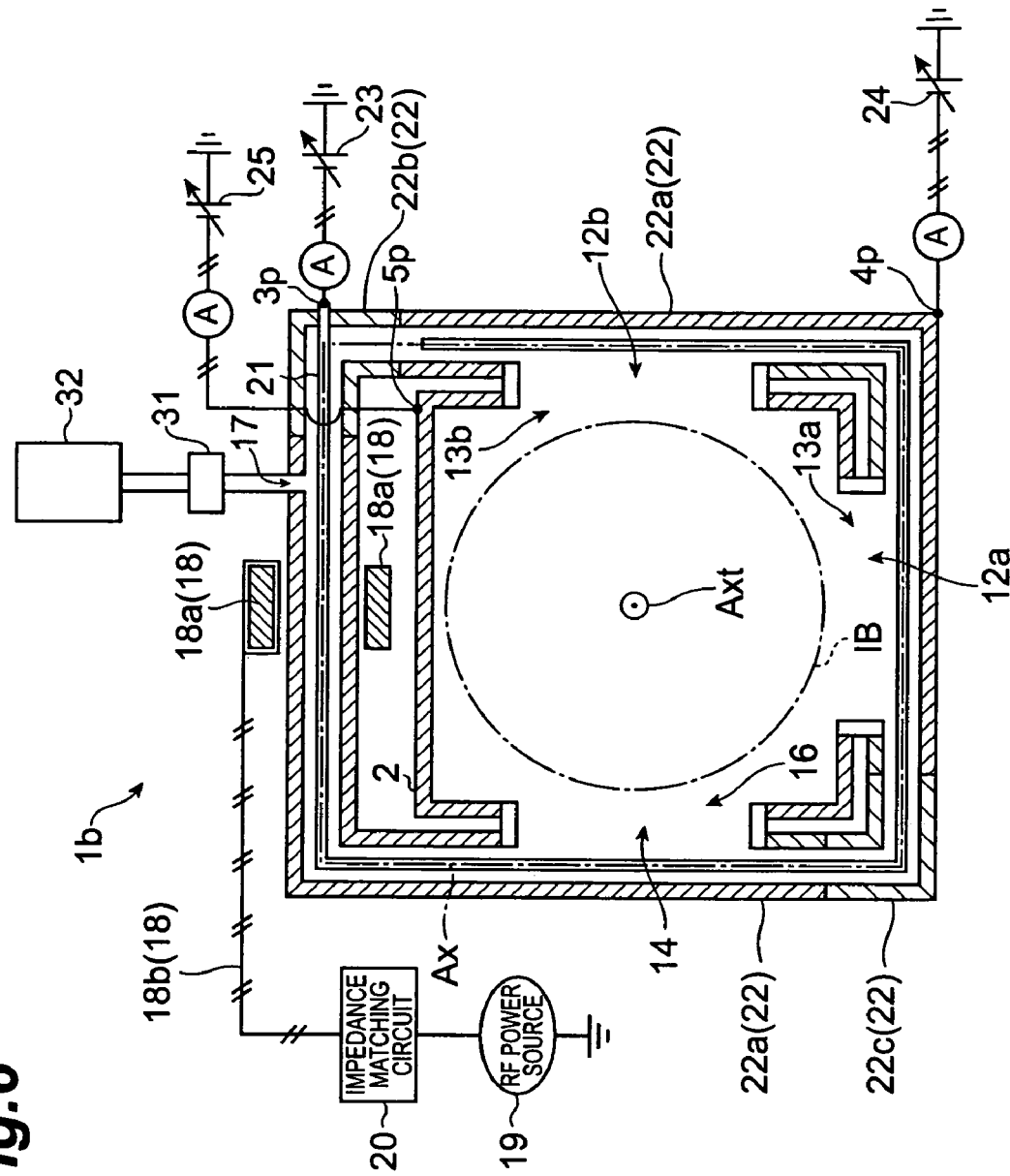
FIG. 6 is a cross-sectional view showing a part of the ion implantation system comprising an electron flood apparatus according to the third embodiment.

FIG. 6 is a cross-sectional view schematically showing a portion of an ion implantation system comprising an electron flood apparatus 1b according to the third embodiment. The ion implantation system has the electron flood apparatus 1b, which has replaced the electron flood apparatus 1 shown in FIGS. 2 to 4.

In the electron flood apparatus 1b, an annular chamber 22 extending along a predefined closed curve Ax surrounds a tube 2. The chamber 22 has, in addition to the opening 14, other openings 12a and 12b. The tube 2 has, in addition to an opening 16, other openings 13a and 13b to be in communication with the other openings 12a and 12b.

Therefore, the electron flood apparatus 1b can supply electrons into the tube 2 from a plurality of paths, whereby electrons can be supplied into the entire tube 2. Furthermore, even in cases where the diameter of the ion beam IB is large or the ion beam IB is scanned, a sufficient amount of electrons can be supplied to the ion beam IB.

(Fourth Embodiment)

Figure 7:
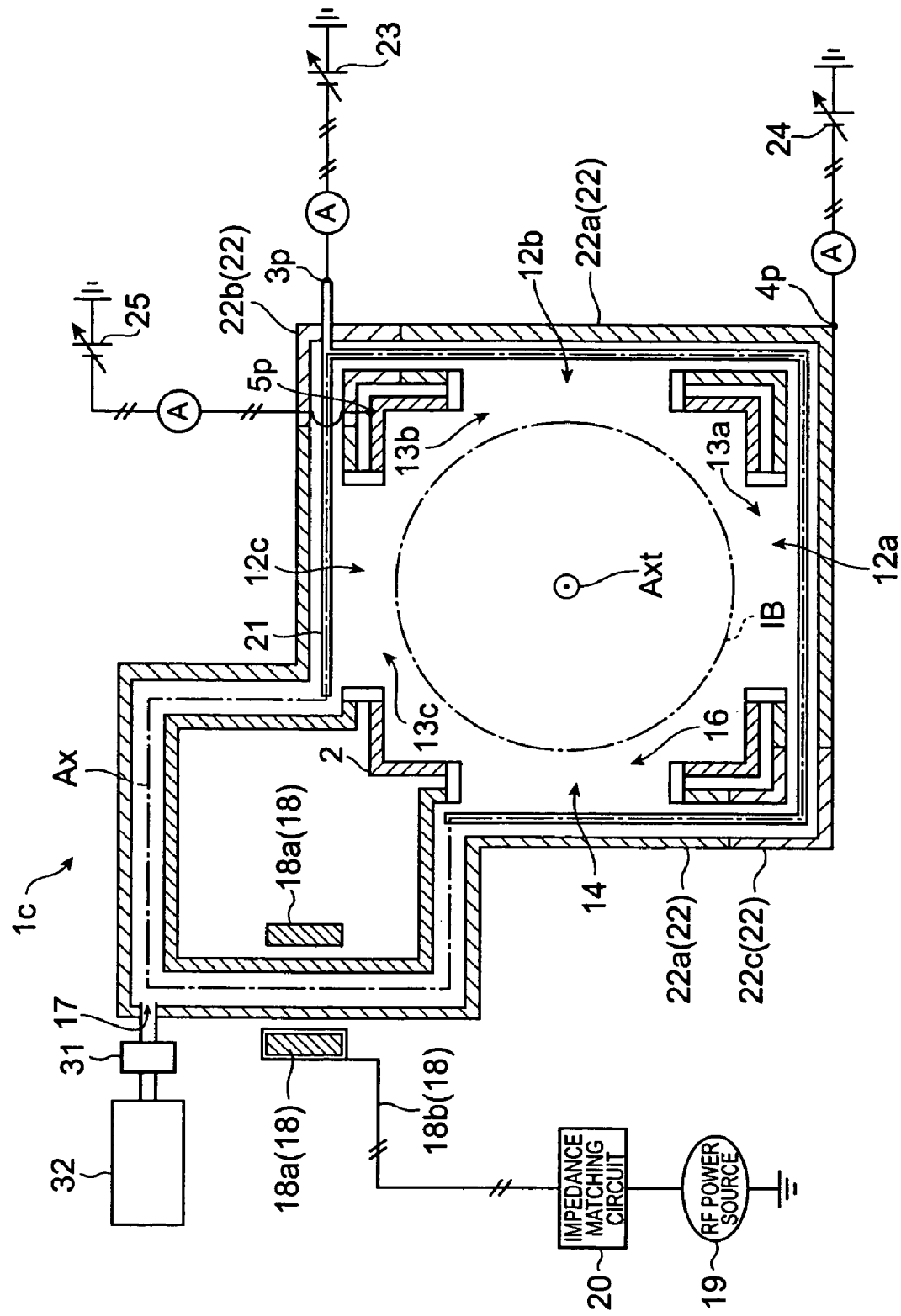
FIG. 7 is a cross-sectional view showing a part of the ion implantation system comprising an electron flood apparatus according to the fourth embodiment.
Figure 8:
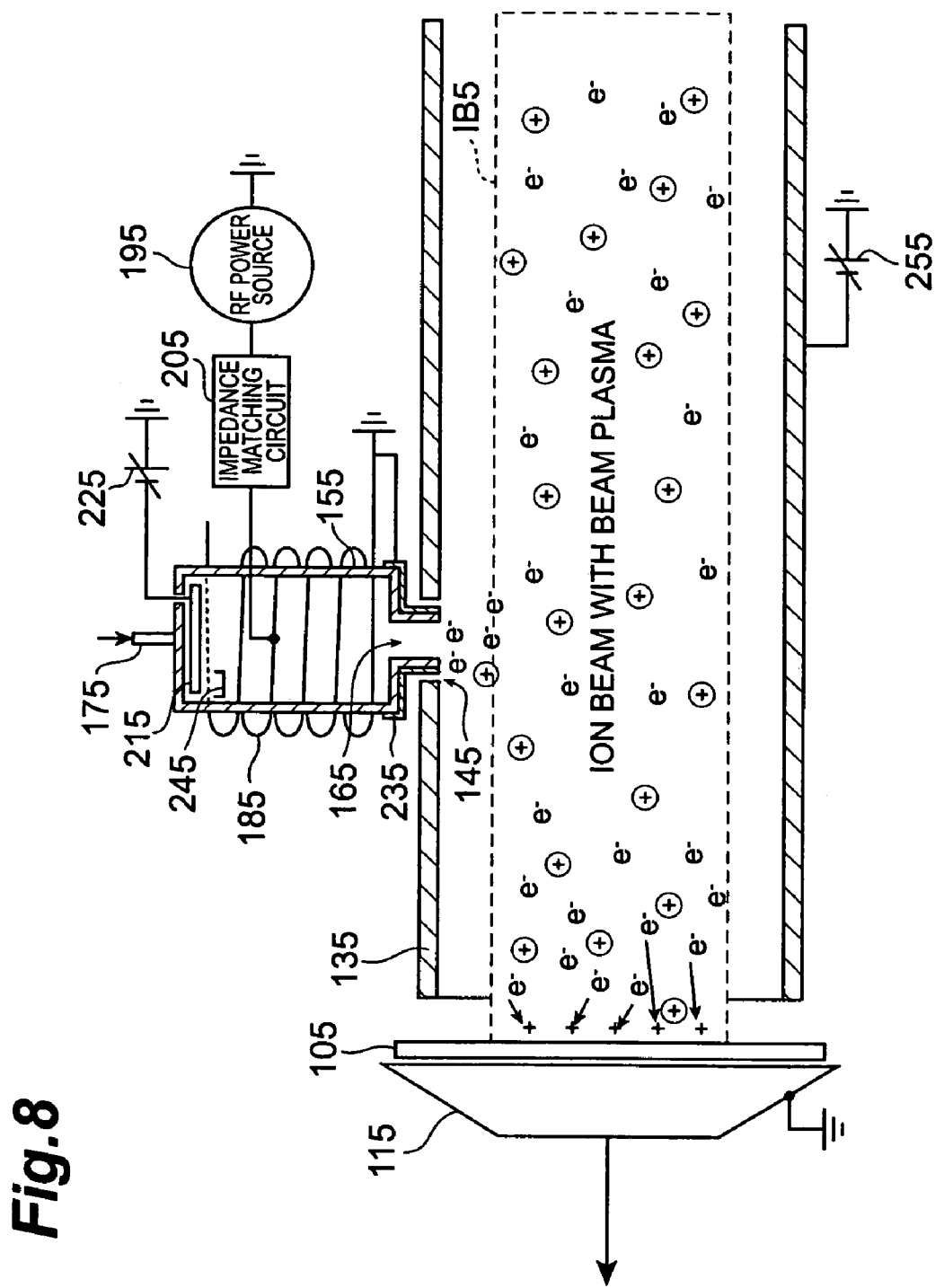

FIG. 7 is a cross-sectional view schematically showing a portion of an ion implantation system comprising an electron flood apparatus 1c according to the fourth embodiment. The ion implantation system has the electron flood apparatus 1c, which has replaced the electron flood apparatus 1b shown in FIG. 6.

The chamber 22 of the electron flood apparatus 1c has another opening 12c in addition to the opening 14 and the other openings 12a and 12b. The tube 2 has another opening 13c in addition to the opening 16 and the other openings 13a and 13b. The other opening 13c, being in communication with the other opening 12c of the chamber 22, can supply electrons into the entire tube 2.

Although the present invention has been explained referring to the preferred embodiments in the above, the present invention is not limited to the above embodiments.

For example, although the chamber 22 of each of the electron flood apparatuses 1, 1a, 1b, and 1c of the above-mentioned first to fourth embodiments has the annular conductor part segmented by two insulative parts, namely the second and third parts 22b and 22c, plasma can be generated in the chamber 22 if segmented by at least one insulative part. For example, if there is one insulative part, the chamber 22 comprises a first cylindrical part 22a made of conductive material and a second cylindrical part 22b made of insulating material arranged in sequence along a predefined closed curve Ax, but does not comprise the third part 22c made of insulating material. Even in such a case, plasma is generated mainly due to inductive coupling in the chamber 22. In addition, increasing the number of insulative parts segmenting the conductive parts of the chamber 22 facilitates generation of plasma.

In addition, the electron flood apparatuses 1b and 1c shown in FIGS. 6 and 7 may be configured as a structure not including the electrode 21 as described with the electron flood apparatus 1a shown in FIG. 5. In this case, the electron flood apparatuses 1b and 1c comprise a chamber 22, a coil 18, and a terminal 4p, as with the electron flood apparatus 1a. In a structure wherein the electron flood apparatuses 1b and 1c do not have the electrode 21, plasma can also be generated in the chamber 22 as long as the chamber 22 is segmented by at least one insulative part.

According to the present invention, electrons having a low energy can be emitted, whereby an electron flood apparatus and an ion implantation system comprising the same can be provided which reduce maintenance workload.

What is claimed is:

1. An electron flood apparatus for use in an ion implantation system for generating electrons, said apparatus comprising:
   a chamber of the electron flood apparatus having an opening for emitting said electrons, a supply port for supplying inert gas, a first part made of conductive material and a second part made of insulating material, and the chamber of the electron flood apparatus extending along a predefined closed curve;
   a magnetic field generator provided outside said first part to generate a magnetic field in a direction intersecting with a surface formed by said predefined closed curve; and
   an electrode provided inside said chamber.

2. The electron flood apparatus according to claim 1, wherein said chamber, being insulated from said electrode, supports said electrode and said electrode extends along said predefined closed curve.

3. The electron flood apparatus according to claim 1, wherein the chamber is annular the first part is cylindrical, the second part is cylindrical, and wherein the direction intersecting with a surface formed by said predefined closed curve is a direction intersecting with a surface formed by said annular chamber.

4. The electron flood apparatus according to claim 3, wherein said chamber, being insulated by the electrode, supports said electrode, and said electrode extends along said chamber.

5. The electron flood apparatus according to claim 1 further comprising:
   a cathode power source electrically connected to said electrode; and
   a high-frequency power source electrically connected to said magnetic field generator.

6. An electron flood apparatus for use in an ion implantation system for generating electrons, said apparatus comprising:
   a chamber of the electron flood apparatus having an opening for emitting said electrons, a supply port for supplying inert gas, a first part made of conductive material and a second part made of insulating material, and the chamber of the electron flood apparatus extending along a predefined closed curve;
   a magnetic field generator provided outside said first part to generate a magnetic field in a direction intersecting with a surface formed by said predefined closed curve; and
   a terminal electrically connected to said first part.

7. The electron flood apparatus according to claim 6, wherein the chamber is annular, the first part is cylindrical, the second part is cylindrical, and wherein the direction intersecting with a surface formed by said predefined closed curve is a direction intersecting with a surface formed by said annular chamber.

8. The electron flood apparatus according to claim 6 further comprising:
   a cathode power source electrically connected to said terminal; and
   a high-frequency power source electrically connected to said magnetic field generator.

9. The electron flood apparatus according to claim 1, wherein said magnetic field generator is a coil with conductive wire wound around the core made of magnetic material.

10. The electron flood apparatus according to claim 1, wherein said chamber has a third part made of insulating material.

11. An ion implantation system comprising:
    an electron flood apparatus comprising:
      a chamber of the electron flood apparatus having an opening for emitting said electrons, a supply port for supplying inert gas, a first part made of conductive material and a second part made of insulating material, and the chamber of the electron flood apparatus extending along a predefined closed curve;
      a magnetic field generator provided outside said first part to generate a magnetic field in a direction intersecting with a surface formed by said predefined closed curve; and
      a terminal electrically connected to the chamber of the electron flood apparatus; and
    a tube through which an ion beam passes, wherein a side wall of said tube has an opening in communication with said opening of said chamber of said electron flood apparatus.

12. The ion implantation system according to claim 11, wherein said chamber has another opening, and said side wall of said tube has another opening in communication with said another opening of said chamber.

13. The ion implantation system according to claim 11, wherein said inert gas includes at least one of rare gas and nitrogen gas.

14. The electron flood apparatus according to claim 6, wherein said magnetic field generator is a coil with conductive wire wound around the core made of magnetic material.

15. The electron flood apparatus according to claim 6, wherein said chamber has a third part made of insulating material.

16. The ion implantation system of claim 11, wherein the terminal is electrically connected to the first part of the chamber.

17. The ion implantation system of claim 11, further comprising an electrode provided inside the chamber.

* * * * *

UNITED STATES PATENT AND TRADEMARK OFFICE
CERTIFICATE OF CORRECTION

| | | |
|---|---|---|
| PATENT NO. | : 7,126,138 B2 | Page 1 of 1 |
| APPLICATION NO. | : 10/942619 | |
| DATED | : October 24, 2006 | |
| INVENTOR(S) | : Ito et al. | |

It is certified that error appears in the above-identified patent and that said Letters Patent is hereby corrected as shown below:

Column 1, Line 3: After the title and before the heading "BACKGROUND OF THE INVENTION", insert the following paragraph:

--This application claims priority of Japan Application Serial No. 2003-328800, filed Sep. 19, 2003.--

Column 1, Line 24: Delete the paragraph break after "life"

Column 1, Lines 25-26: Delete "This application claims priority to Japan Application Serial No. 2003-328800, filed Sep. 19, 2003."

Column 1, Line 40: Change "185" to --IB5--

Column 9, Claim 3, Line 63: Insert a comma after "annular"

Signed and Sealed this

Thirteenth Day of March, 2007

JON W. DUDAS
*Director of the United States Patent and Trademark Office*